United States Patent
Seddon et al.

(10) Patent No.: US 7,342,534 B1
(45) Date of Patent: Mar. 11, 2008

(54) PHASED ARRAY RADIO FREQUENCY PULSE GENERATOR

(75) Inventors: Nigel Seddon, Bristol (GB); Christopher R. Spikings, Bristol (GB)

(73) Assignee: Bae Systems, plc, Farnborough, Hampshire (GB)

( * ) Notice: Subject to any disclaimer, the term of this patent is extended or adjusted under 35 U.S.C. 154(b) by 1826 days.

(21) Appl. No.: 09/184,399

(22) Filed: Nov. 3, 1998

(51) Int. Cl.
*H01Q 3/26* (2006.01)
*H01Q 3/30* (2006.01)
*H03H 7/32* (2006.01)

(52) U.S. Cl. .................. 342/375; 333/139; 333/140
(58) Field of Classification Search ................ 342/375; 333/139, 138, 140
See application file for complete search history.

(56) References Cited

U.S. PATENT DOCUMENTS

| | | | | |
|---|---|---|---|---|
| 3,028,597 A | * | 4/1962 | Cicchetti et al. | 342/372 |
| 3,425,002 A | * | 1/1969 | Okamura | 333/144 |
| 4,203,081 A | * | 5/1980 | Braeckelmann | 333/138 |
| 5,157,272 A | * | 10/1992 | Seddon | 307/106 |

FOREIGN PATENT DOCUMENTS

GB    2317752    *  4/1998

* cited by examiner

*Primary Examiner*—Gregory C Issing
(74) *Attorney, Agent, or Firm*—Nixon & Vanderhye P.C.

(57) ABSTRACT

A phased array radio frequency pulse generator includes a plurality of radio frequency pulse generator units (4, 4a, 4b, 4c) each having a non-linear dispersive electrical circuit (1) incorporating at least one non-linear element (5) including a material sensitive to low power signals (7) and a means (6) for producing a variable power control signal (7) and applying it to be at least one non-linear element (5) to modify the extent of the non-linearity of the element and thereby vary the timing of the radio frequency electrical output signal generated, and means (13) for adjusting the value of the control signals (7) provided in each unit (4, 4a, 4b, 4c), to vary the relative phases of the output signals from the units (4, 4a, 4b, 4c) in a phased array on a pulse to pulse basis.

14 Claims, 2 Drawing Sheets

PHASED ARRAY RADIO FREQUENCY PULSE GENERATOR

BACKGROUND OF THE INVENTION

1. Field of the Invention

This invention relates to a phased array radio frequency pulse generator particularly suitable for producing a plurality of pulsed radio frequency electrical signals.

2. Discussion of Prior Art

In the field of high power radio frequency and microwave generators it is advantageous to be able to operate a plurality of individual sources in a phased array. By the term high power is meant peak powers of at least one MW and preferably as high as peak powers of at least 100 MW. Additionally in this specification the term radio frequency is used to cover radiation in the high frequency, very high frequency, ultra high frequency and microwave regions of the electromagnetic spectrum.

Operating a plurality of individual radio frequency transmitter sources in an array in which the relative phase of radio frequency emission from each element can be controlled is desirable. This allows the generation of high radiation powers at a distance from the phased array source and also allows the formation of a directed beam of radiation. The operation of phased array transmitters is common place at low power levels from each array element such as less than 100 kW but existing radio frequency sources which are used to produce higher power of up to 100 MW or more radio frequency pulses are not operable in phased arrays.

Conventional high power radio frequency and microwave sources are magnetrons, klystrons and travelling wave tubes (TWT's). Generally these devices operate by generating a beam of electrons which passes through a period mechanical structure. The electron beam interacts with the mechanical structure and energy is extracted from the electron beam to produce a radio frequency or microwave field inside the mechanical structure which is typically a cavity. Radio frequency or microwave energy is then extracted from the cavity as required. Radar transmitters have utilised electron beam/resonant cavity devices of this kind and phased arrays have been developed which use these devices. Conventionally beam formation in an array of radio frequency transmitter elements is controlled by phased scanning and time delay scanning.

Conventionally phase scanning phase shifters are incorporated at the output of each radio frequency modulator element with the phase shifters being electronically actuated to control the phase excitation of each of the radiating elements. Conventional phase shifters are usually based on diodes or on ferrite components. The power handling capacity of such diode phase shifters is generally limited to about 1 kW peak power and the power handling capacity of conventional ferrite phase shifters is limited to about 100 kW peak power.

In the case of time delay scanning conventionally incremental delays are introduced between each radio frequency modulator and the corresponding radiating element. These delays may be introduced by including switched delay lines or switched circulators but however introduced these conventional electronically controlled delay devices are also limited in power handling capacity to approximately 100 kW peak power.

There is thus a need for a generally improved phased array radio frequency pulse generator which will allow for electronic control of the relative phase of the parts therein which produce high peak power radio frequency pulses, for example with peak powers of 100 MW or higher.

SUMMARY OF THE INVENTION

According to one aspect of the present invention there is provided a phased array radio frequency pulse generator for producing a plurality of pulsed radio frequency electrical signals, including a plurality of radio frequency pulse generator units each having a non-linear dispersive electrical circuit incorporating at least one non-linear element including a material sensitive to low power signals and a means for producing a variable power control signal and applying the control signal to the at least one non-linear element to modify the extent of the non-linearity of the element and thereby vary the timing of the radio frequency electrical output signal generated, and means for adjusting the value of the control signals provided in each unit to vary the relative phases of the output signals from the radio signal pulsed generator units in a phased array on a pulse to pulse basis.

Preferably each unit non-linear dispersive electrical circuit includes a plurality of non-linear elements in the form of inductors interconnected in series, a first array of coupling capacitors each linking the input side of one inductor to the output side of the next inductor in line for dispersive purposes, and a second array of capacitors arranged in parallel to one another such that each capacitor of the second array connects the input side of a different inductor to a common electrical line.

Conveniently the or each non-linear element material is a ferromagnetic material sensitive to a magnetic field and the control signal producing means is operable to produce a relatively small variable electric current which gives rise to a variable low value magnetic field which is applied to the ferromagnetic material to adjust the initial state of the non-linear element and alter the behaviour of the non-linear element during modulation of a high power radio frequency signal to change the timing of the radio frequency signal outputted from the generator unit.

Advantageously each control signal producing means includes a source of low power direct current which is applied to the input side of the non-linear dispersive electrical circuit with a high voltage input and which is returned to the source from the output side of the non-linear dispersive electrical circuit at the radio frequency signal output.

Preferably the or each non-linear element material is ferroelectric sensitive to an electric field and each control signal producing means is operable to produce a variable low value electric field which is applied to the ferroelectric material to adjust the initial state of the non-linear element and alter the behaviour of the non-linear element during modulation of a high power radio frequency signal to change the timing of the radio frequency signal outputted from the generator unit.

Conveniently the control signal adjusting means is a computer control linked to each source of low power direct current and operable to vary the value of the control signals provided in each unit.

BRIEF DESCRIPTION OF THE DRAWINGS

For a better understanding of the present invention, and to show how the same may be carried into effect, reference will now be made, by way of example, to the accompanying drawings in which.

DETAILED DISCUSSION OF PREFERRED EMBODIMENTS

Figure 1:
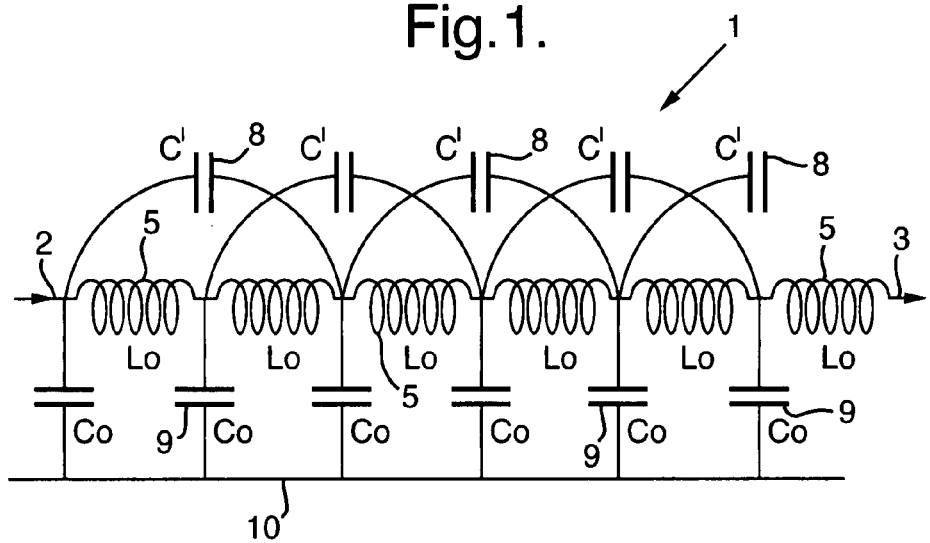
FIG. 1 is a schematic diagram of a non-linear dispersive electrical circuit forming part of a radio frequency pulse generator unit utilised in a generator according to the present invention.

A pulsed radio frequency signal is produced according to the present invention by modulation of an electrical pulse in a non-linear dispersive electrical circuit generally indicated at 1 in FIG. 1 of the accompanying drawings. An electrical pulse that has a short pulse rise time and a flat top although the flat top is not essential, is injected into the circuit 1 at 2. The non-linear and dispersive characteristics of the circuit 1 modify the shape of the pulse that is injected at 2 to produce a radio frequency output pulse at point 3. The circuit 1 does not require the production of electron beams and subsequent interaction with a resonant mechanical structure and the circuit may be implemented in solid state as it does not contain vacuum elements, large magnets or gas supplies. The radio frequency formation process in the circuit 1 is a complex process that depends on the interaction of non-linearity and dispersion. Factors such as the efficiency of radio frequency generation, the frequency of the radio frequency output and the duration of the radio frequency output pulse are dependent on the specific details of the non-linear and dispersive characteristics of the circuit. However the use of a non-linear dispersive circuit 1 allows formation of radio frequency signals with very high peak powers capable of producing radio frequency pulses with peak powers of 100 MW or higher.

Figure 3:
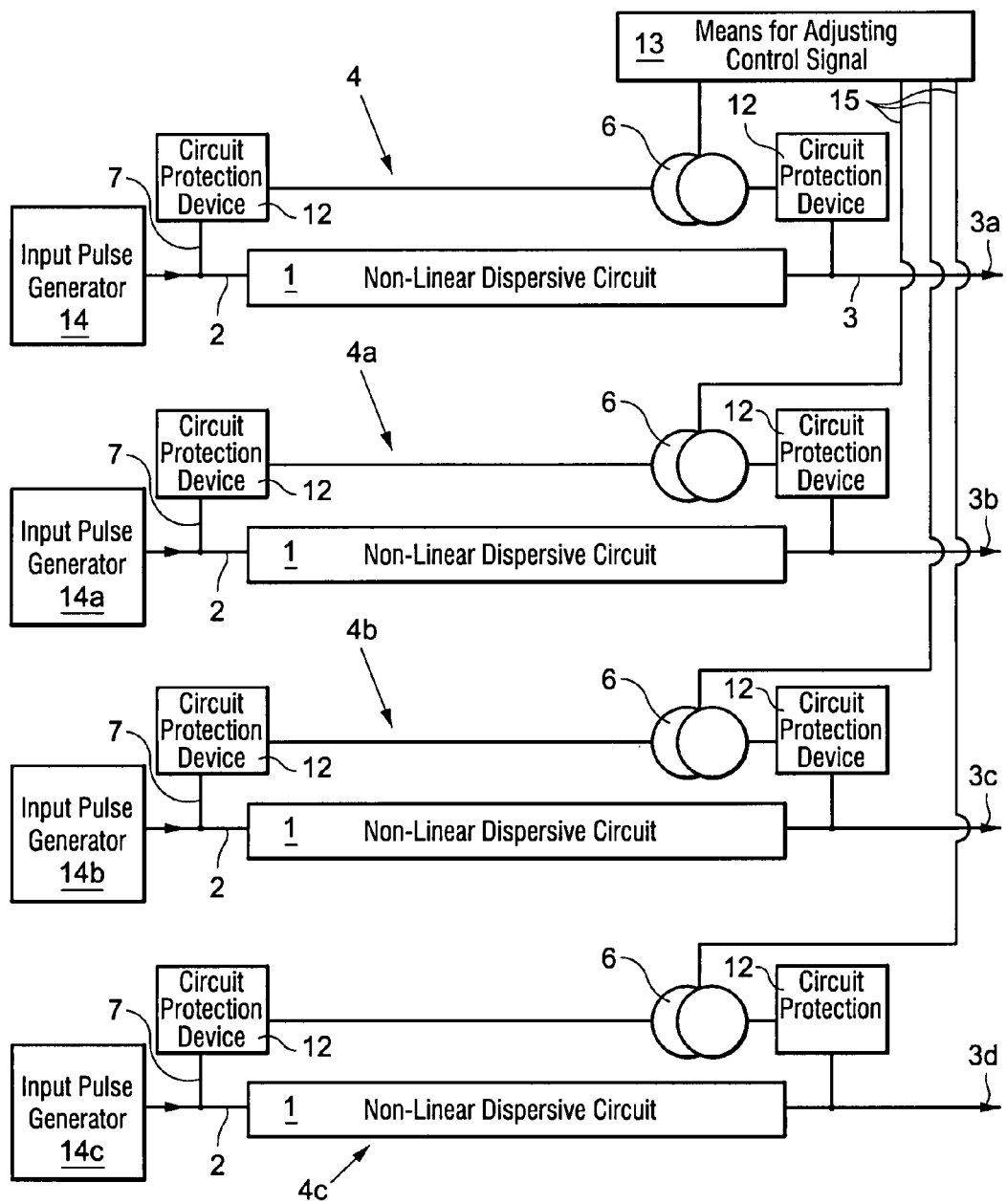
FIG. 3 is a diagrammatic view of a phased array radio frequency pulse generator according to the present invention.

Basically a phased array radio frequency pulse generator according to the present invention as shown in FIG. 3 of the accompanying drawings, is intended to produce a plurality of pulsed radio frequency electrical signals 3$a$, 3$b$, 3$c$ and 3$d$. To this end the generator includes a plurality of radio frequency pulse generator units 4, 4$a$, 4$b$ and 4$c$. As many units may be employed as desired depending upon the number of desired output radio frequency signals 3.

Each unit 4, 4$a$, 4$b$, 4$c$ has a non-linear dispersive electrical circuit as shown in FIG. 1 of the accompanying drawings incorporating at least one non-linear element such as inductor 5 including a material sensitive to low power signals. Each unit 4, 4$a$, 4$b$ and 4$c$ also includes a means 6 for producing a variable power control signal 7 and for applying the signal 7 to the at least one non-linear element 5 to modify the extent of the non-linearity of the element 5 and thereby vary the timing of the radio frequency electrical output signal generated at 3.

Variation in non-linearity of the circuits 1 is achieved by selecting non-linear components which are sensitive to low power control signals. Thus the non-linear elements 5 contain a material such as a ferromagnetic material which is sensitive to a magnetic field or a ferroelectric material which is sensitive to a low value electric field. A low value control signal 7 such as a relatively small current or a relatively small electric field is used to adjust the initial state of the non-linear element 5 in each circuit 1 to alter the behaviour of the element 5 during modulation of a high power radio frequency signal and subsequently change the timing of the radio frequency output which is produced at point 3. Adjustment of the control signals 7 to each circuit 1 then allow changes to be made to the relative phases of the output the circuits 1 in a phased array on a pulse to pulse basis.

Although FIG. 3 of the accompanying drawings illustrates an embodiment of the invention of the present application which uses saturable magnetic material for the elements 5 to provide non-linear characteristics, it is to be understood that the invention is not limited to the use of saturable magnetic materials for the elements 5 which may instead be implemented in ferroelectric materials.

Thus in the circuit of FIG. 1 forming part of each unit 4 includes a plurality of non-linear elements 5 in the form of inductors interconnected in series. Also forming part of each circuit 1 is a first array of coupling capacitors 8 each having a capacitance $C^1$ and each linking the input side of one inductor 5 to the output side of the next inductor 5 in line for dispersive purposes. Additionally each circuit 1 includes a second array of capacitors 9 arranged in parallel to one another such that each capacitor 9 connects the input side of a different inductor 5 to a common electrical line 10. Each inductor 5 has an inductance $L_0$ and each capacitor 9 has a capacitance $C_0$.

Six inductors 5 are shown in the FIG. 1 circuit corresponding to six sections of an inductance/capacitance transmission line but as many inductors as required may be utilised. The capacitors 8 provide additional dispersive characteristics for the line of inductors in order to enhance the convergence of energy from the input pulse at 2 to the radio frequency output signal at 3. The position of the dispersive or coupling capacitors 8 as shown in FIG. 1 is only one example and suitable dispersive properties may be provided for the circuit 1 by other arrangements of capacitors or additional inductor elements.

For a high power generator the input pulse which is injected at point 2 into the circuit 1 is a high voltage pulse for example of 50 kV. The current associated with this pulse is also of high value, for example 2 kA. The high current pulse propagates from left to right in the circuit of FIG. 1 with the propagation velocity of the pulse being determined partly by the value of the inductance element $L_o$ of the elements or inductors 5.

In the circuit of FIG. 1 and the embodiment of FIG. 3, non-linearity may be added to the circuit 1 by including a saturable magnetic material in each inductor 5. For example the inductors 5 may be formed from a conductive wire which is threaded with soft saturable ferrite magnetic beads. In this event the magnetic field which is associated with the input pulse 2 kA is applied to the ferrite toroid in a circumferential direction. Whilst the magnetic material is in an unsaturated state its presence increases the value of each circuit inductance to a value greater than $L_o$. If the magnetic material is forced into a saturated state the value of the inductance falls to the lower limiting value $L_0$. The non-linear magnetic material may be used to effect the propagation of the input pulse along the transmission line through the circuit 1. The presence of unsaturated magnetic material in each of the elements 5 inhibits the flow of current along the circuit such that the propagation velocity of the front of the input pulse is reduced by the presence of unsaturated magnetic material. Consequently the injected current pulse propagates from the input to the output of the circuit 1 at a velocity which is determined partly by the initial state of the non-linear circuit element 5. If an electrical pulse with a flat top is injected at point 2 into the circuit 1, energy is transferred into an oscillating radio frequency signal component. The radio frequency pulse is formed at the leading edge of the injected input pulse and the leading edge of the first radio frequency cycle is coincident with the leading edge of the injected pulse as it propagates through the circuit 1.

The effect of changing the propagation velocity of the injected pulse in the circuit of FIG. 1 will be to change the time of arrival of the radio frequency pulse at the output point 3. Thus for a ferromagnetic material for the element 5 the control signal producing means 6 as shown in FIG. 3 is a source of low power direct current which is applied at 7 to the input side of the circuit 1 with the high voltage input and which is returned to the source 6 from the output side of the circuit 1 at the radio frequency signal output point 3, 3a, 3b, 3c, 3d. Thus the initial condition of each non-linear element 5 can be adjusted by means of the control signal 7 so as to control the propagation velocity of the input pulse and consequently control the time of arrival of the radio frequency output pulse at point 3. In the case of non-linearity which is based on saturable magnetic material, the initial state of the magnetic material can be adjusted by passing a small direct current of typically less than 100 mA through the inductors 5.

Injection of the direct current prior to injection of the high current pulse at 2 sets the condition of the non-linear element 5 such that the circuit 1 allows a particular propagation velocity. Variation of the direct current control signal level 7 then allows variation of the timing of the radio frequency pulse at the output point 3 of the circuit 1.

Figure 2:
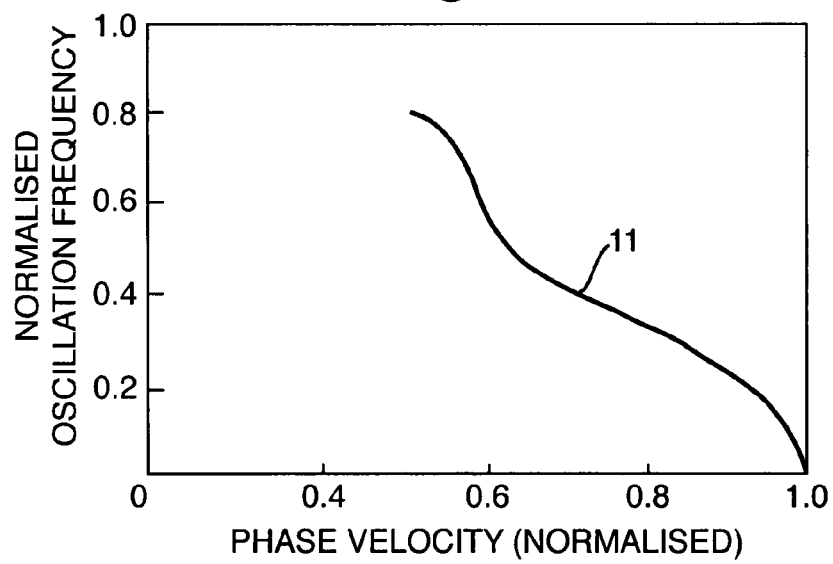
FIG. 2 is a graph of oscillation frequency versus phase velocity showing a typical dispersion curve for the circuit of FIG. 1.

The frequency of the radio frequency pulse produce at point 3 by each circuit 1 is dependent on the phase velocity with this dependency being shown in FIG. 2 for a typical non-linear dispersive transmission circuit 1. Thus in FIG. 2 the dispersion curve is shown at 11. Variation in the initial state of the elements or inductors 5 will also introduce some change to the radio frequency pulse frequency at point 3 in addition to change in timing of the radio frequency pulse at point 3. However the magnitude of changes in component non-linearity in the circuit 1 which are required to make significant changes to the radio frequency oscillation frequency are much larger than those required to make significant changes to the timing of the radio frequency output pulse at point 3. Thus the relative timing of radio frequency signals can be changed without introducing significant variations in the radio frequency pulse frequency from each phased array unit 4, 4a, 4b, 4c. The characteristics of the circuits 1 can be designed such that the radio frequency oscillation frequency is relatively insensitive to change in the phase velocity.

As shown in FIG. 3 passage of the direct current control signal from the source 6 is via circuit protection devices 12 which protect the source 6 from a high voltage pulse which is also injected into the circuit 1 at point 2. Passage of the low value direct current control signal through the inductors 5 in each circuit 1 produces a magnetic field around each inductor 5 which couples with the saturable magnetic material in each inductor 5. The direct current control signal 7 is used to set the initial condition of the saturable magnetic material in each inductor 5 and in effect is used to set the saturable magnetic material at a certain point on its hysterises loop. The initial set position can be varied continuously between positive and negative saturation values for the saturable magnetic material by selecting the level of direct current in the signal 7 appropriately.

The generator of the present invention as shown in FIG. 3 of the accompanying drawings is made up as a phased array of circuits 1 and control signal producing means 6 in parallel arrangement. Each circuit 1 is used as one unit in a phased-array and is controlled by a single means 13 for adjusting the value of the control signal 7 to each circuit 1 in each unit 4, 4a, 4b and 4c to vary the relative phases of the output signals 3a, 3b, 3c and 3d from the units 4, 4a, 4b, and 4c respectively in a phased array on a pulse to pulse basis. As shown in the FIG. 3 embodiment each unit 4, 4a, 4b and 4c has its own associated input pulse generator 14, 14a, 14b, and 14c respectively. Conveniently the control signal adjusting means 13 is a computer control linked directly to each source 6 of low power direct current via lines 15 and operable to vary the value of the control signal 7 provided in each unit 4, 4a, 4b and 4c.

Although in the generator of the invention as shown in FIG. 4, 4 units of an array are illustrated in practice the generator may have any desired number of units 4, 4a, 4b, 4c. Each radiating antenna, not shown, is driven by a separate non-linear dispersive circuit 1 and each circuit is controlled by its own source 6. The input pulse injected to each circuit 1 can be derived alternatively from a single input pulse source (not shown) in which case a very high power pulse is produced which is then split to feed the individual circuits 1.

Thus the generator of FIG. 3 allows a relatively simple low power direct current supply to be used to control the relative timing of the output from a number of very high power radio frequency pulse generator units 4. Variation of the value of the current in the control signal 7 can be achieved in a short time such as in less than 1 millisecond. This technique significantly increases the peak powers which can be produced by a phased array of radio frequency units. This also allows rapid adjustment of the relative phase of the units 4.

The invention claimed is:

1. A phased array radio frequency pulse generator for producing a plurality of pulsed radio frequency electrical signals, including a plurality of radio frequency pulse generator units each having a non-linear dispersive electrical circuit incorporating at least one non-linear element including a material sensitive to low power signals and a means for producing a variable power control signal and applying the control signal to the at least one non-linear element to modify the extent of the non-linearity of the element and thereby vary the timing of the radio frequency electrical output signal generated, and means for adjusting the value of the control signals provided in each unit to vary the relative phases of the output signals from the radio frequency pulse generator units in a phased array on a pulse to pulse basis.

2. A generator according to claim 1, wherein each unit non-linear dispersive electrical circuit includes a plurality of non-linear elements in the form of inductors interconnected in series, a first array of coupling capacitors each linking the input side of one inductor to the output side of the next inductor in line for dispersive purposes, and a second array of capacitors arranged in parallel to one another such that each capacitor of the second array connects the input side of a different inductor to a common electrical line.

3. A generator according to claim 1, wherein the or each non-linear element material is a ferromagnetic material sensitive to a magnetic field and wherein the control signal producing means is operable to produce a relatively small variable electric current which gives rise to a variable low value magnetic field which is applied to the ferromagnetic material to adjust the initial state of the non-linear element and alter the behaviour of the non-linear element during modulation of a high power radio frequency signal to change the timing of the radio frequency signal outputted from the generator unit.

4. A generator according to claim 3, wherein each control signal producing means includes a source of low power direct current which is applied to the input side of the non-linear dispersive electrical circuit with a high voltage input and which is returned to the source from the output side of the non-linear dispersive electrical circuit at the radio frequency signal output.

5. A generator according to claim 1, wherein the or each non-linear element material is ferroelectric material sensitive to an electric field and wherein each control signal producing means is operable to produce a variable low value electric field which is applied to the ferroelectric material to adjust the initial state of the non-linear element and alter the behaviour of the non-linear element during modulation of a high power radio frequency signal to change the timing of the radio frequency signal outputted from the generator unit.

6. A generator according to claim 4, wherein the control signal adjusting means is a computer control linked to each source of low power direct current and operable to vary the value of the control signals provided in each unit.

7. A phased array radio frequency pulse generator for producing a plurality of pulsed radio frequency signals, including:
   a plurality of radio frequency pulse generator units, each unit comprising:
      a non-linear dispersive electrical circuit incorporating at least one non-linear element including a material sensitive to low power signals; and
      a source of low power direct current for producing a variable power control signal and applying the control signal to the at least one non-linear element to modify the extent of the non-linearity of the element and thereby vary the timing of the radio frequency electrical output signal generated;
   and programmed digital computer control for adjusting the value of the control signals provided in each unit to vary the relative phases of the output signals from the radio frequency pulse generator units in a phased array on a pulse to pulse basis.

8. A generator according to claim 7, wherein each unit non-linear dispersive electrical circuit includes a plurality of non-linear elements in the form of inductors interconnected in series, a first array of coupling capacitors each linking the input side of one inductor to the output side of the next inductor in line for dispersive purposes, and a second array of capacitors arranged in parallel to one another such that each capacitor of the second array connects the input side of a different inductor to a common electrical line.

9. A generator according to claim 7, wherein each non-linear element material is a ferromagnetic material sensitive to a magnetic field and wherein the source of low power direct current is operable to produce a relatively small variable electric current which gives rise to a variable low value magnetic field which is applied to the ferromagnetic material to adjust the initial state of the non-linear element and alter the behavior of the non-linear element during modulation of a high power radio frequency signal to change the timing of the radio frequency signal outputted from the generator unit.

10. A generator according to claim 9, wherein each source of low power direct current includes a source of low power direct current which is applied to the input side of the non-linear dispersive electrical circuit with a high voltage input and which is returned to the source from the output side of the non-linear dispersive electrical circuit at the radio frequency signal output.

11. A generator according to claim 7, wherein the or each non-linear element material is ferroelectric material sensitive to an electric field and wherein each control signal producing means is operable to produce a variable low value electric field which is applied to the ferroelectric material to adjust the initial state of the non-linear element and alter the behavior of the non-linear element during modulation of a high power radio frequency signal to change the timing of the radio frequency signal outputted from the generator unit.

12. A generator according to claim 10, wherein the computer is a computer control linked to each source of low power direct current and operable to vary the value of the control signals provided in each unit.

13. A phased array radio frequency pulse generator for producing a plurality of pulsed radio frequency signals, said generator comprising:
   a plurality of radio frequency pulse generator units, each unit comprising
      a non-linear dispersive electrical circuit incorporating at least one non-linear element including a material sensitive to low power signals; and
      a source of low power direct current for producing a variable power control signal and applying the control signal to the at least one non-linear element to modify the extent of the non-linearity of the element and thereby vary the timing of the radio frequency electrical output signal generated; and
   a programmed digital computer control for adjusting the value of the control signals provided in each unit to vary the relative phases of the output signals from the radio frequency pulse generator units in a phased array on a pulse to pulse basis, wherein the or each non-linear element material is a ferromagnetic material sensitive to a magnetic field and wherein the source is operable to produce a relatively small variable electric current which gives rise to a variable low value magnetic field which is applied to the ferromagnetic material to adjust the initial state of the non-linear element and alter the behavior of the non-linear element during modulation of a high power radio frequency signal to change the timing of the radio frequency signal outputted from the generator unit, wherein each source includes a source of low power direct current which is applied to the input side of the non-linear dispersive electrical circuit with a high voltage input and which is returned to the source from the output side of the non-linear dispersive electrical circuit at the radio frequency signal output.

14. A generator according to claim 13, wherein the computer is a computer control linked to each source of low power direct current and operable to vary the value of the control signals provided in each unit.

* * * * *